United States Patent [19]

Jones et al.

[11] Patent Number: 4,962,416
[45] Date of Patent: Oct. 9, 1990

[54] ELECTRONIC PACKAGE WITH A DEVICE POSITIONED ABOVE A SUBSTRATE BY SUCTION FORCE BETWEEN THE DEVICE AND HEAT SINK

[75] Inventors: Alan L. Jones, Endwell; Keith A. Synder, Vestal, both of N.Y.

[73] Assignee: International Business Machines Corporation, Armonk, N.Y.

[21] Appl. No.: 182,639

[22] Filed: Apr. 18, 1988

[51] Int. Cl.$^5$ .................. H01L 23/36; H01L 23/40
[52] U.S. Cl. .......................... 357/81; 357/82; 357/79
[58] Field of Search .................. 357/81, 82, 70, 79; 361/387, 386

[56] References Cited

U.S. PATENT DOCUMENTS

| | | | |
|---|---|---|---|
| 3,492,535 | 1/1970 | Behrendt | 317/100 |
| 4,069,498 | 1/1978 | Joshi | 357/81 |
| 4,092,697 | 5/1978 | Spaight | 361/386 |
| 4,231,154 | 11/1980 | Gazdik et al. | 29/840 |
| 4,233,645 | 11/1980 | Balderes et al. | 361/285 |
| 4,323,914 | 4/1982 | Berndlmaier et al. | 357/70 |
| 4,386,116 | 5/1983 | Nair et al. | 427/99 |
| 4,415,025 | 11/1983 | Horvath | 165/185 |
| 4,442,450 | 4/1984 | Lipschutz et al. | 357/81 |
| 4,517,051 | 5/1985 | Gazdik et al. | 156/644 |
| 4,546,410 | 10/1985 | Kaufman | 361/387 |
| 4,563,725 | 1/1986 | Kirby | 361/386 |
| 4,681,654 | 7/1987 | Clementi et al. | 156/630 |

OTHER PUBLICATIONS

IBM Technical Disclosure Bulletin, vol. 18, No. 2, Jul. 1975, EN8740377, "Thermally Enhanced Multilayer Ceramic Substrate Structure", by Q. K. Kerjilian, et al.
IBM Technical Disclosure Bulletin, vol. 20, No. 4, Sep. 1977, FI8760890, "Method of Effective Cooling of a High Power Silicon Chip", by V. Y. Doo, et al.
IBM Technical Disclosure Bulletin, vol. 20, No. 4, 9/77, "Hot-Pressed In-Dot Module", by D. Balderes, et al.
IBM Technical Disclosure Bulletin, vol. 20, No. 11B, 4/78 "Liquid-Metal-Cooled Integrated Circuit Module Structures", by E. Berndlmaier, et al.
IBM Technical Disclosure Bulletin, vol. 20, No. 12, 5/78, "LSI Cooling Technique", by M. Cases, et al.
IBM Technical Disclosure Bulletin, vol. 27, No. 7B, 12/84 "Bump Internal-Thermal Enhancement", by W. C. Yeh.
A Facsimile Report by United States Department of Energy, Office of Scientific and Technical Information, "Heat-Transfer Microstructures for Integrated Circuits", by D. B. Tuckerman, 2/84.

Primary Examiner—Rolf Hille
Assistant Examiner—S. V. Clark
Attorney, Agent, or Firm—Lawrence R. Fraley

[57] ABSTRACT

An electronic package including a first circuitized substrate (e.g., printed circuit board) a second, flexible circuitized substrate (e.g., polyimide), an electronic device (semiconductor chip) and a metallic (e.g., aluminum) heat sink member joined to the first substrate to provide a cover for the package's internal components. A predetermined quantity of liquid material (e.g. wax or oil) is located between a defined surface of the chip and a corresponding internal surface of the heat sink member during assembly of the package, this material possessing a surface tension sufficient to create a suction force between the device and heat sink so as to elevate the device in a spaced position from (e.g., above) the first circuitized substrate during said assembly. Should a liquid material such as oil be utilized, this material remains in the liquid state during package operation to continuously provide the defined suction force sufficient to maintain the device at the elevated position. If a material such as wax is used, this material becomes solidified and remains so during package operation to thus maintain the device in elevated position by adhesion. Improved heat dissipation for the package and ease of assembly thereof is thus possible.

30 Claims, 1 Drawing Sheet

ELECTRONIC PACKAGE WITH A DEVICE POSITIONED ABOVE A SUBSTRATE BY SUCTION FORCE BETWEEN THE DEVICE AND HEAT SINK

TECHNICAL FIELD

The invention relates to electronic packages and more particularly to such packages which utilize circuitized substrates designed for having semiconductor chips mounted thereon.

BACKGROUND

Electronic packages having circuitized substrates, whether of the flexible or rigid variety, are known, with examples being defined in U.S. Pat. Nos. 4,092,697 and 4,415,025 (both employing rigid, ceramic substrates) and 4,231,154 (employing a flexible thin film substrate). All of these patents are assigned to the assignee of the instant invention and are incorporated herein by reference. As will be further understood from the teachings herein, the invention is most particularly directed to packages as defined above wherein a heat-sinking cover member is utilized. Such a cover is also described in both 4,092,697 and 4,415,025 and desired in many such electronic packages to provide positive heat dissipation from the package during operation thereof. Understandably, such heat escape is essential in packages of this type to promote the operational life thereof.

As defined herein, the package of the instant invention provides for such heat escapement on an enhanced basis through the direct contact between the package's chip and heat-sinking cover wherein the chip is maintained at an elevated position above a first, circuitized substrate. Such an elevated arrangement assures protection of the chip during package assembly as well as reducing both the time and costs for such assembly. Such chip elevation should also further promote heat escape from the package during operation.

It is believed that an electronic package possessing the above advantageous features, among others, would constitute a significant advancement in the art.

DISCLOSURE OF THE INVENTION

It is a primary object of the invention to enhance the electronic package art by providing an electronic package possessing, among others, the above-identified features.

In accordance with one aspect of the invention, there is provided an electronic package comprising a first circuitized substrate having at least one layer of circuitry thereon, a second circuitized substrate of flexible nature including at least one layer of circuitry thereon electrically connected to the first circuitized substrate, and an electronic device having first and second opposing surfaces, the circuitry on the second, flexible circuitized substrate being connected to designated locations on the second opposing surface of the device. The device is oriented at a spaced, elevated position from the first circuitized substrate. The package further includes a heat sink member having a surface facing the electronic device, and a predetermined quantity of liquid material positioned between and in contact with both the first surface of the electronic device and the surface of the heat sink facing the device. The liquid material possesses a surface tension sufficient to create a suction force between the electronic device and the heat sink to maintain the electronic device in the spaced, elevated relationship from the first circuitized substrate during operation of the electronic package.

In accordance with another aspect of the invention, there is provided an electronic package comprising a first circuitized substrate having at least one layer of circuitry thereon, a second circuitized substrate of flexible nature including at least one layer of circuitry thereon electrically connected to said first circuitized substrate, and an electronic device having first and second opposing surfaces. The circuitry on the second, flexible circuitized substrate is connected to designated locations on the second opposing surface of said device with the device being oriented in a spaced, elevated position from the first circuitized substrate. The package further includes a heat sink member including a surface facing the electronic device and a predetermined quantity of solidified material positioned between and in contact with both the first surface of the electronic device and the surface of said heat sink member facing the device. The material thus serves to maintain the electronic device in the spaced, elevated relationship from the first circuitized substrate during operation of the electronic package, the solidified material being applied to either or both of said surfaces in liquid form during assembly of said electronic package and thereafter allowed to assume said solidified state.

BEST MODE FOR CARRYING OUT THE INVENTION

For a better understanding of the present invention, together with other and further objects, advantages and capabilities thereof, reference is made to the following disclosure and appended claims in connection with the above-described drawings.

Figure 1:
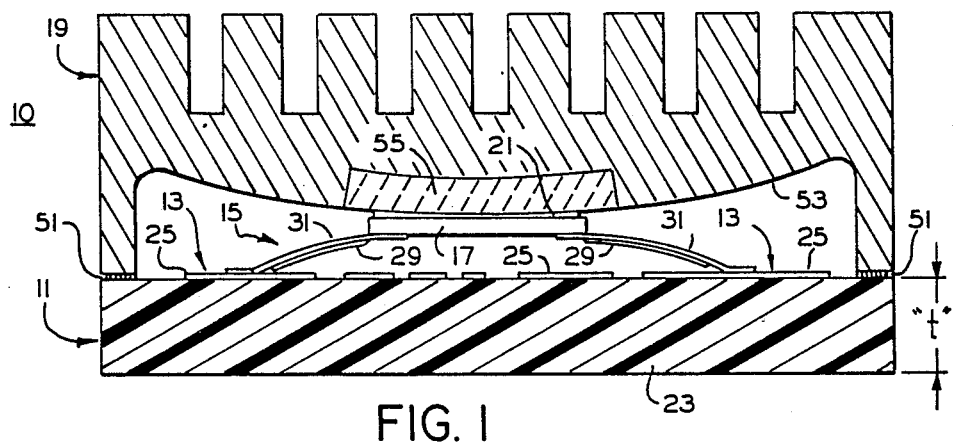
FIG. 1 is a side elevational view, in section, of an electronic package in accordance with a preferred embodiment of the invention.
Figure 2:
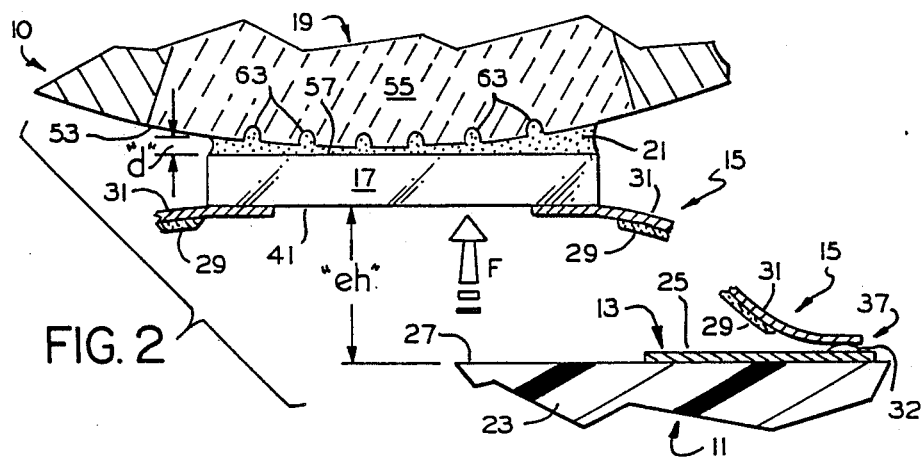
FIG. 2 is a much enlarged, partial view of the package of FIG. 1 more clearly illustrating the elevated position of the invention's chip and the direct connection between the chip and the invention's heat-sinking cover.

In FIG. 1, there is shown an electronic package 10 in accordance with a preferred embodiment of the invention. Package 10 includes a first circuitized substrate 11 having at least one layer of circuitry 13 thereon, a second circuitized substrate 15 of flexible nature electrically connected to first substrate 11, an electronic device (semiconductor chip) 17 electrically connected to second substrate 15 and located in an elevated position above substrate 11, a heat sink member 19 joined to the first substrate 11 and providing a cover for package 10, and a predetermined quantity of material 21 positioned between and in contact with heat sink member 19 and device 17 to thus assure direct contact therebetween to provide enhanced heat dissipation for the invention during operation thereof. As understood from the following, material 21 may be in either a liquid (as shown in FIGS. 1 and 2) or solidified state in the final, assembled package (and during operation thereof). In either instance, however, material 21 is in liquid state during initial assembly so as to facilitate such assembly. As defined below, material 21, if in liquid form in final state, forms a surface tension on the respective surfaces of member 19 and device 17 sufficient to create a suction force between member 19 and device 17 so as to uniquely maintain the device at the illustrated, elevated position during package operation using such force. If in a liquid state (e.g., an oil) in the assembled, final package configuration (and operation), material 21 exerts the defined herein suction force during both said assembly and operation of package 10. If in a solid state (e.g., a wax) in the final, assembled package, material 21 exerts the defined herein suction force only during package assembly (to "lift" the device and attached flexible substrate 15 to the desired elevation), and thereafter, being solidified, maintains the device in this elevated position by adhesion. Furthermore, if material 21 is in a liquid state in the final package, it does not act as an adhesive but, as stated, uniquely maintains the semiconductor device at its elevated position through the suction force defined herein. Understandably, this capability represents a significant feature of the invention.

First substrate 11 is preferably a printed circuit board having an insulative (e.g., epoxy) body portion 23 with a formed metallic (e.g., copper) layer of circuitry 25 located on a top surface 27 (FIG. 2) thereof. Circuitry 25 includes individual conductive segments (as shown) spacedly located on surface 27 and which may be formed on substrate 11 using any one of a number of conventional circuit forming techniques (e.g., photo-etched from blanket metal foil.

First substrate 11 is preferably of rigid construction. Specifically, the body portion 23 thereof, is of an epoxy or similar material as preferred, and preferably possesses a thickness (dimension "t" in FIG. 1) of at least 0.030 inch. Known substrates having thicknesses up to about 0.200 inch are acceptable.

Figure 3:
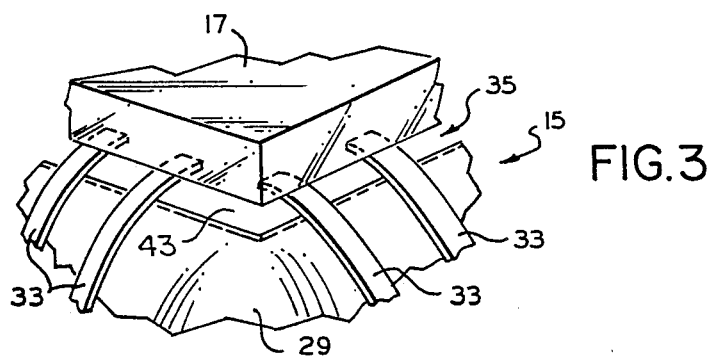
FIG. 3 is a partial perspective view illustrating the preferred means of electrically connecting the inner leads of the invention's flexible, circuitized substrate to the bottom surface of the invention's chip.

Second circuitized substrate 15, as stated, is of a flexible nature and includes an insulative portion 29 of organic dielectric material (e.g., polyimide) having a defined layer of circuitry 31 (e.g., chrome-copper-chrome) thereon. As shown, circuitry 31 is located on an upper surface of the polyimide material and serves to interconnect circuitry 25 on first substrate 11 with respective contact locations on the bottom surface of semiconductor chip 17. Substrate 15 may be electrically connected to circuitry 25 using any one of a number of conventional connection techniques e.g., soldering, wherein at least one solder ball 32 is used for each of the individual segments 3 (FIG. 3). As better shown in FIG. 3, second circuitized substrate 15 includes a plurality of individual conductive segments 33 located on the polyimide in accordance with a defined pattern. This pattern in turn defines first and second arrays 35 and 37 (FIG. 2) of individual projecting end portions for these segments. The first arrays 35, as depicted in the drawings, are electrically connected to respective contact locations on the lower surface 41 of semiconductor chip 17 preferably using a conventional technique (e.g., thermal compression bonding). The opposing ends of each segment 33 thus serve to form the second arrays 37, each of which are individually connected (i.e., using the aforementioned solder ball technology) to a designated, respective one of the conductive segments 25 located on surface 27 of substrate 11.

As also shown in FIG. 3, the polyimide material 29 for substrate 15 defines an opening 43 therein having the described first array 35 of projecting end segments extending therein. Chip 17 is thus located relative to opening (or window) 43 in the manner shown in FIG. 3. As stated, second circuitized substrate 15 is flexible in nature. By this term is meant that the polyimide and circuit elements, taken together, possess an overall thickness of only about 0.003 inch. Such a capability on the part of substrate 15 represents a significant aspect of the invention for purposes which are understood from the description provided herein.

Heat sink member 19, as shown in FIGS. 1 and 2, is preferably metallic (e.g., aluminum or copper) and is sealed to substrate 11 using a known sealing technique (e.g., a flowed and subsequently cured epoxy 51). If body portion 23 is of ceramic, sealant 51 may be a low temperature brazing or solder material. As shown, heat sink 19 is sealed to substrate 11 about the outer periphery thereof to thus provide a cover for the internal components (i.e., chip 17, second substrate 15) shown in FIG. 1. Heat sink 19 further preferably includes a curvilinear interior surface 53 which curves in a direction toward substrate 11 (convexly downward in FIG. 1). In a preferred embodiment of the invention, heat sink 19 includes a silicon insert 55 centrally located therein relative to the adjacent semiconductor chip 17 (FIGS. 1 and 2). In the broader aspects of the invention, however, use of this insert may be excluded with chip 17 instead directly contracting the metallic interior surface.

As shown in FIGS. 1 and 2, semiconductor chip 17 is oriented in a spaced, elevated position (at a predefined height as indicated by the dimension "eh" in FIG. 2) from the upper surface 27 of first substrate 11. As stated, this occurs during package assembly and is facilitated by the suction force created by the liquid wax or oil material. This represents a significant aspect of the instant invention in that it allows direct connection between chip 17 and the curvilinear surface 53 of heat sink 19 to thus provide enhanced heat escapement for the finished package 10 during operation thereof. As stated above, such heat escapement is essential in packages of this type to assure an appropriate operating life therefor. Elevating chip 17 in the manner defined herein also facilitates assembly of package 10 in that it enables placement of the defined heat sink on first substrate 11 and sealing thereof without potential harm to the chip. Understandably, placement of the heat sink on substrate 11 could result in damage to the chip as might be caused by compression thereof between surfaces 53 and 27. The dimension "eh" thus provides sufficient tolerance to prevent such compression and possible corresponding destruction or damage to the relatively delicate semiconductor chip. In a preferred embodiment, dimension "eh" is preferably within the range of from about 0.001 inch to about 0.004 inch.

Chip 17 may be selected from known chips in the art (e.g., CMOS), and as depicted in the drawings, includes the aforementioned lower surface 41 and an upper surface 57 on the opposite side thereof. As shown in FIG. 2, both of these surfaces are substantially planar as is typical in devices of this type. In the preferred embodiment of the invention, the chip's planar upper surface 57 aligns with and is retained against the curvilinear surface 53 of heat sink 19. It is to be understood, however, that within the broader aspects of the instant invention, other configurations for these two surfaces can be employed. For example, it is within the scope of the invention to utilize a substantially planar surface for heat sink 19 (in addition to using a metallic surface instead of one containing the insert 55, as mentioned above).

As stated above, package 10 includes a predetermined quantity of the aforementioned material 21 positioned between and in contact with surface 57 of chip 17 and surface 53 of heat sink 19 to uniquely provide a means whereby chip 17, as attached to the flexible substrate 15, is maintained at the defined elevated position above first substrate 11 during operation of package 10. Material 21, if in liquid state during package operation, is preferably an oil possessing a surface tension sufficient to create a suction force (F in FIG. 2) between chip 17 and heat sink 19 to assure that the chip is maintained in the illustrated position during package assembly and operation. Examples of suitable materials which maintain the liquid state during package operation include highly refined mineral oil, silicone oils, or others, such as those currently utilized in vacuum diffusion pumps (e.g., mixed 5 ring polyphenylether or perfluoropolyether).

If wax is the selected material 21, it is applied to surface 57 of chip 17 in heated liquid form but, as stated, will assume solidified form after assembly (and thus during package operation). Material 21, whether oil or wax, is applied to either/both surfaces 53 or 57 during assembly of package 10 prior to sealing of heat sink 19 to the first substrate 11. The chip, with flexible substrate attached, is then "lifted" to effect engagement with the heat sink's internal surface. As described, locating chip 17 at this elevated position during such sealing prevents damage to the chip as might be caused by compression between the heat sink and lower substrate members. It has been determined that a suction force F within the range of about 0.5 gram to about 1.5 gram, and ideally about 1.0 gram, is required to maintain a chip of the type defined herein at the described elevated position when utilizing the other components (i.e., flexible circuitized substrate 15) as also defined herein.

As shown in FIG. 2, material 21, when in liquid form, forms a meniscus between chip 17 and heat sink 19. As also shown in FIG. 2, this meniscus possesses a concave configuration about the upper peripheral edge of the chip. This configuration is deemed necessary in order to assure the sufficient suction force as defined herein. The quantity of liquid material 21 deemed adequate to provide the described surface tension and resulting suction force is an amount sufficient to fill a gap (dimension "d") of approximately two micrometers (microns) at the outer edge of chip 17. That is, the distance "d" in this outer edge about the entire periphery of chip 17 and the corresponding, adjacent location on surface 53 is about two microns. In one embodiment (using the aforementioned CMOS chip and polyimide substrate), it was determined that a quantity of 0.1 microliter of liquid material was acceptable.

Suction between chip 17 and heat sink 19 is further enhanced using the aforedefined silicon insert 55 and providing this insert with a plurality of capillary slots therein, which, in a preferred embodiment of the invention, are of longitudinal configuration and run in a substantially parallel orientation across the curvilinear surface 53 of the insert. In the invention as shown in FIG. 2, slots 63 run toward and away from the viewer the desired length thereof. Preferably, slots 63 each possess an overall length within insert 55 sufficient to exceed the outer dimensions of chip 17 by about 0.10 inch. In addition, each slot preferably possesses an outer width of only about 1 or 2 microns. Utilization of the described silicon insert is desired in order to assure provision of slots having these relatively fine dimensions. Provision of slots of said dimensions within a metallic (e.g., copper or aluminum) heat sink is not readily possible. Insert 55 may be securely positioned within heat sink 19 using known means (e.g., solder).

In order to even further assure positive suction between chip 17 and the invention's heat sink member, the curvilinear surface 53 of the silicon insert 55 preferably possesses a roughness characteristic sufficient to increase the surface tension of liquid material 21 therealong. Preferably, this roughness is less than about 1.0 micron.

There has thus been shown and described an electronic package wherein the package's electronic device (semiconductor chip) is maintained in direct contact against the package's heat sink member in a unique manner such that enhanced heat dissipation for the package is attainable. Furthermore, the invention as defined herein provides for ease of manufacture of such a package while also assuring prevention of damage to the relatively delicate semiconductor chip.

While there have been shown and described what are at present considered the preferred embodiments of the invention, it will be obvious to those skilled in the art that various changes and modifications may be made therein without departing from the scope of the invention as defined by the appended claims.

What is claimed is:

1. An electronic package comprising:
   a first circuitized substrate having at least one layer of circuitry thereon;
   a second circuitized substrate of flexible nature including at least one layer of circuitry thereon electrically connected to said first circuitized substrate;
   an electronic device having first and second opposing surfaces, said circuitry on said second, flexible circuitized substrate being connected to designated locations on said second opposing surface of said device, said device being oriented in a spaced, elevated position from said first circuitized substrate;
   a heat sink member including a surface facing said electronic device; and
   a predetermined quantity of liquid material positioned between and in contact with both said first surface of said electronic device and said surface of said heat sink member facing said device, said material possessing a surface tension sufficient to create a suction force between said electronic device and said heat sink member to maintain said electronic device in said spaced, elevated relationship from said first circuitized substrate during operation of said electronic package.

2. The package according to claim 1 wherein said first circuitized substrate is a printed circuit board.

3. The package according to claim 1 wherein said second circuitized flexible substrate is an organic dielectric member having circuitry on at least one surface thereof.

4. The package according to claim 3 wherein the organic dielectric material of said member comprises a polyimide.

5. The package according to claim 3 wherein said circuitry includes first and second arrays of projecting end portions, said first array being electrically connected to said electronic device and said second array being electrically connected to said selected portions of said layer of circuitry on said first circuitized substrate.

6. The package according to claim 5 wherein said second flexible substrate defines an opening therein, said first array of said projecting end portions of said circuitry projecting into said opening, said electronic device thereby being oriented relative to said opening.

7. The package according to claim 1 wherein said surface of said heat sink member having said liquid material thereon is of curvilinear configuration and said first surface of said electronic device having said liquid material thereon is of substantially planar configuration.

8. The package according to claim 7 wherein said curved surface includes a plurality of capillary slots therein, said liquid material also occupying said slots to thereby enhance said suction between said heat sink member and said electronic device.

9. The package according to claim 8 wherein said curved surface having said capillary slots therein is silicon.

10. The package according to claim 9 wherein said silicon comprises an insert located within said heat sink member, the remainder of said heat sink member being metallic.

11. The package according to claim 1 wherein said suction force between said electronic device and said heat sink member is within the range of about 0.5 gram to about 1.5 gram.

12. The package according to claim 1 wherein said liquid material is oil.

13. The package according to claim 1 wherein said liquid material forms a meniscus between said electronic device and said heat sink member, said meniscus having a concave configuration.

14. The package according to claim 1 wherein the distance of the spacing between said first substrate and said electronic device in said elevated position is within the range of from about 0.001 inch to about 0.004 inch.

15. The package according to claim 1 wherein said surface of said heat sink member possesses a roughness of less than 1 micron.

16. An electronic package comprising:
 a first circuitized substrate having at least one layer of circuitry thereon;
 a second circuitized substrate of flexible nature including at least one layer of circuitry thereon electrically connected to said first circuitized substrate;
 an electronic device having first and second opposing surfaces, said circuitry on said second, flexible circuitized substrate being connected to designated locations on said second opposing surface of said device, said device being oriented in a spaced, elevated position from said first circuitized substrate;
 a heat sink member including a surface facing said electronic device; and
 a predetermined quantity of solidified material positioned between and in contact with both said first surface of said electronic device and said surface of said heat sink member facing said device for maintaining said electronic device in said spaced, elevated relationship from said first circuitized substrate during operation of said electronic package, said solidified material being applied to either or both of said surfaces in liquid form during assembly of said electronic package and thereafter allowed to assume said solidified state, said material exerting a suction force between said heat sink and said electronic device to maintain said electronic device in said spaced, elevated position during said assembly.

17. The package according to claim 16 wherein said first circuitized substrate is a printed circuit board.

18. The package according to claim 16 wherein said second circuitized flexible substrate is an organic dielectric member having circuitry on at least one surface thereof.

19. The package according to claim 18 wherein the organic dielectric material of said member comprises a polyimide.

20. The package according to claim 18 wherein said circuitry includes first and second arrays of projecting end portions, said first array being electrically connected to said electronic device and said second array being electrically connected to said selected portions of said layer of circuitry on said first circuitized substrate.

21. The package according to claim 20 wherein said second flexible substrate defines an opening therein, said first array of said projecting end portions of said circuitry projecting into said opening, said electronic device thereby being oriented relative to said opening.

22. The package according to claim 16 wherein said surface of said heat sink member having said solidified material thereon is of curvilinear configuration and said first surface of said electronic device having said liquid material thereon is of substantially planar configuration.

23. The package according to claim 22 wherein said curved surface includes a plurality of capillary slots therein, said solidified material also occupying said slots.

24. The package according to claim 23 wherein said curved surface having said capillary slots therein is silicon.

25. The package according to claim 24 wherein said silicon comprises an insert located within said heat sink member, the remainder of said heat sink member being metallic.

26. The package according to claim 16 wherein said material creates a suction force between said electronic device and said heat sink member when in said liquid state during said assembly of said electronic package, said force being within the range of about 0.5 gram to about 1.5 gram.

27. The package according to claim 1 wherein said solidified material is wax.

28. The package according to claim 16 wherein said material during said assembly and in said liquid state forms a meniscus between said electronic device and said heat sink member, said meniscus having a concave configuration.

29. The package according to claim 16 wherein the distance of the spacing between said first substrate and said electronic device in said elevated position is within the range of from about 0.001 inch to about 0.004 inch.

30. The package according to claim 16 wherein said surface of said heat sink member possesses a roughness of less than 1 micron.

* * * * *